(12) United States Patent
Schmid et al.

(10) Patent No.: US 11,280,861 B2
(45) Date of Patent: Mar. 22, 2022

(54) SHEATH WAVE BARRIER FOR MAGNETIC RESONANCE (MR) APPLICATIONS

(71) Applicant: SKOPE MAGNETIC RESONANCE TECHNOLOGIES AG, Zurich (CH)

(72) Inventors: Thomas Schmid, Zurich (CH); Otto David Brunner, Jona (CH)

(73) Assignee: SKOPE MAGNETIC RESONANCE TECHNOLOGIES AG, Zurich (CH)

(*) Notice: Subject to any disclaimer, the term of this patent is extended or adjusted under 35 U.S.C. 154(b) by 0 days.

(21) Appl. No.: 16/973,875

(22) PCT Filed: Jun. 17, 2019

(86) PCT No.: PCT/EP2019/065913
§ 371 (c)(1),
(2) Date: Dec. 10, 2020

(87) PCT Pub. No.: WO2019/243274
PCT Pub. Date: Dec. 26, 2019

(65) Prior Publication Data
US 2021/0181278 A1    Jun. 17, 2021

(30) Foreign Application Priority Data

Jun. 17, 2018  (EP) .................................. 18178152
Aug. 31, 2018  (EP) .................................. 18192134

(51) Int. Cl.
*G01R 33/36*  (2006.01)
*G01R 33/34*  (2006.01)
(Continued)

(52) U.S. Cl.
CPC ... *G01R 33/3685* (2013.01); *G01R 33/34092* (2013.01); *G01R 33/38* (2013.01);
(Continued)

(58) Field of Classification Search
CPC .......... G01R 33/3685; G01R 33/34092; G01R 33/38; G01R 33/46; G01R 33/48; G01R 33/1895
See application file for complete search history.

(56) References Cited

U.S. PATENT DOCUMENTS

| 4,682,125 A | 7/1987 | Harrison et al. |
| 4,922,204 A | 5/1990 | Duerr et al. |

(Continued)

FOREIGN PATENT DOCUMENTS

| WO | 2013057643 A1 | 4/2013 |
| WO | 2015150507 A1 | 10/2015 |
| WO | 2018077679 A1 | 5/2018 |

OTHER PUBLICATIONS

WIPO, written opinion issued in PCT/EP2019/065913 dated Dec. 26, 2019.

*Primary Examiner* — Dixomara Vargas
(74) *Attorney, Agent, or Firm* — Agris & Von Natzmer, LLP; Joyce Von Natzmer

(57) ABSTRACT

A sheath wave barrier (2) for suppressing electromagnetic RF coupling phenomena of an electrical cable (4) at a predetermined suppression frequency (coo) in a magnetic resonance (MR) imaging or spectroscopy apparatus, wherein the cable is configured as a shielded cable with at least one inner conductor (6) and a peripherally surrounding electrically conducting cable sheath (8), comprises a segment of said shielded cable and a primary inductor formed from said shielded cable segment between a first cable location (12) and a second cable location (14). A secondary inductor (16) formed by a conductor is concentrically arranged within or around the primary inductor between said first and second cable locations. The secondary inductor is electrically connected to the cable sheath at said first and second cable connections over respective first and second (Continued)

RLC network members (M1, M2), the primary and secondary inductors being configured in compensating manner such that magnetic field generated by said primary and secondary inductors is substantially cancelled in any region surrounding the sheath wave barrier.

16 Claims, 5 Drawing Sheets

(51) Int. Cl.
    *G01R 33/38*     (2006.01)
    *G01R 33/46*     (2006.01)
    *G01R 33/48*     (2006.01)
    *H01B 11/18*     (2006.01)

(52) U.S. Cl.
    CPC ............ *G01R 33/46* (2013.01); *G01R 33/48* (2013.01); *H01B 11/1895* (2013.01)

(56) References Cited

U.S. PATENT DOCUMENTS

| | | | |
|---|---|---|---|
| 5,294,886 A | 3/1994 | Duerr | |
| 5,477,147 A | 12/1995 | Friedrich et al. | |
| 5,543,713 A | 8/1996 | Arakawa et al. | |
| 6,320,385 B1* | 11/2001 | Burl | G01R 33/3657 324/322 |
| 6,605,775 B1 | 8/2003 | Seeber et al. | |
| 7,170,293 B2* | 1/2007 | Kess | G01R 33/3685 324/322 |
| 7,518,368 B2* | 4/2009 | Festag | G01R 33/3415 324/318 |
| 8,803,526 B2* | 8/2014 | Otake | G01R 33/3685 324/322 |
| 2005/0270116 A1 | 12/2005 | Hergt et al. | |
| 2008/0169816 A1* | 7/2008 | Festag | G01R 33/3415 324/322 |
| 2009/0021261 A1 | 1/2009 | Chmielewski et al. | |
| 2011/0267062 A1* | 11/2011 | Otake | G01R 33/3685 324/322 |
| 2012/0262177 A1 | 10/2012 | Eiermann et al. | |

* cited by examiner

SHEATH WAVE BARRIER FOR MAGNETIC RESONANCE (MR) APPLICATIONS

CROSS-REFERENCE TO RELATED APPLICATIONS

This is the U.S. national stage of International application PCT/EP2019/065913, filed Jun. 17, 2019 designating the United States and claiming priority to European patent application no. EP 18178152.7, filed Jun. 17, 2018 and European patent application no. EP 18192134.7, filed Aug. 31, 2018.

FIELD OF THE INVENTION

The present invention generally relates to a sheath wave barrier for suppressing electromagnetic RF coupling phenomena of an electrical cable in an MR apparatus.

BACKGROUND OF THE INVENTION

The operation of an MR apparatus, including but not limited to MR imaging (MRI), constitutes a harsh electromagnetic environment for any devices used in the vicinity of the imaging volume. Such devices must withstand strong magnetic fields and high-power radio-frequency (RF) pulses.

Any cable running within the scanner bore of an MRI apparatus is prone to interact with the RF field leading to surface currents on the cable shield. These currents can have a number of adverse effects:

in close vicinity of patients, they can produce excessive power absorption in the human tissue, potentially resulting in tissue burns;

RF-power can flow along the cable out of the bore;

the currents on the cables alter the RF field distribution within the bore; and surface currents can enter the signal paths if shielding is not perfect.

To avoid such problems, so-called cable traps intended to act as surface wave suppressors, also called "sheath wave barriers", are typically placed onto cables exposed to strong RF fields. However, broadband suppression by means of components with ferro- or ferrimagnetic properties is typically not applicable in MRI due to highly undesirable interactions with the strong magnetic background fields present within the scanner bore. Rather than that, conductive and dielectric structures introducing a high impedance are typically used in MR systems. While unwanted RF signals on DC and low-frequency signal lines are typically blocked by introducing inductors, analogously constructed devices for coaxial cables and cables with multiple lines would become too large for most applications. However, by tuning the trap circuit to resonance by lumped or distributed capacitances, it produces a localized high impedance (enhanced by the quality factor of the resonance) for surface waves at one or several suppression frequencies despite the comparably low reactance of the inductive geometrical structure. By appropriate tuning of the resonance properties, such traps can be designed to have at least one predetermined suppression frequency. The downside of such trap structures is that the electromagnetic resonance field within and around the trap can interact directly with the RF field. In such a case, the trap can convert into an RF pickup-coil. Furthermore, due to the resonance conditions, the sensitivity of the trap to external electromagnetic fields can become very high. In the worst case, the surface currents on the cable can then even be increased by the trap. Equally, if several traps need to be arranged in a setup, mutual coupling between two traps can either detune the individual trapping circuits and/or introduce unwanted coupling between the MR antennas and signal lines. Finally, the traps can also couple to the MRI antenna structure itself resulting in a loss of efficiency, SNR and other performance parameters as well as compromising the safety and stability of the entire setup.

In principle, these undesirable effects can be avoided by i) placing the trap away from any strong external RF fields, other traps and antennas, e.g. by placing the trap in a region where the cable leaves the sensitive volume of any RF transmit coils of the MR apparatus and distant from each other;

ii) configuring the trap in such manner that the coupling between the transmit field generated by the RF transmit coils and the trap internal field is minimized.

The first approach has strong practical limitations due to restricted available space in the magnet bore. The second approach is partially accomplished with common concepts of "figure-8" or toroid winding patterns (U.S. Pat. No. 5,294,886 A), (see FIGS. 1a and 1b of the present application), where induced currents (partially) superimpose destructively, thus strongly suppressing the effective coupling with the external field or by shielded structures (U.S. Pat. No. 4,682,125 A). However, given that in MR applications mostly low-loss coaxial cables are employed, the structures of such traps can become quite large due to the finite bending radius such cables. The previously presented toroidal structure offers imperfect decoupling to external fields due to the limited density of windings and also due to the missing compensation of the net winding around the main axis of the toroid. Adding an appropriate compensating turn would require a narrow U-turn of the cable which is usually prohibited by the mechanical properties of the coaxial cable. The resulting toroid has therefore at least one effective inductive cross-section equal to that of a circle with a radius corresponding to the mean radius of the toroid. Also, structures like the figure-8 disclosed in U.S. Pat. No. 5,294,886 A are, due to their incomplete symmetry, not decoupled from nonuniform RF fields. On the other hand, shielded traps and traps employing large conductive surfaces often exhibit unwanted interaction with the MRI scanner's gradient coils due to eddy current induction. Local magnetic fields generated by such eddy currents can impair image quality and generate vibrations and large forces on the electronics in the MRI system. Finally, the size of floating trapping structures (see U.S. Pat. No. 6,605,775 B1) as well the amount of conductive material required for their construction often prohibit application of such structures to the decoupling individual signal lines and signal lines in close vicinity to the imaging region.

Further traps according to the state of the art are disclosed in U.S. Pat. No. 4,922,204 A and in U.S. Pat. No. 5,543,713 A.

WO 2018/077679 A1 discloses a balun for use in MR imaging. The balun comprises two concentrically arranged solenoids.

SUMMARY OF THE INVENTION

In view of the above, there is a need for an improved field sheath wave barrier for use in a magnetic resonance (MR) imaging or spectroscopy apparatus that overcomes or at least reduces the above-mentioned disadvantages and limitations.

Therefore, according to one aspect of the invention, there is provided a sheath wave barrier for suppressing electromagnetic RF coupling phenomena of an electrical cable at a predetermined suppression frequency ($\omega_0$) in a magnetic resonance (MR) imaging or spectroscopy apparatus, the cable being configured as a shielded cable with at least one inner conductor and a peripherally surrounding electrically conducting cable sheath, the sheath wave barrier comprising:

a segment of said shielded cable;
a primary inductor formed from said shielded cable segment between a first cable location and a second cable location;
a secondary inductor formed by a conductor, said secondary inductor being concentrically arranged within or around the primary inductor between said first and second cable locations;
said secondary inductor being electrically connected to the cable sheath at said first and second cable connections over respective first and second RLC network members;
said primary and secondary inductors being configured in compensating manner such that magnetic field generated by said primary and secondary inductors is substantially cancelled in any region surrounding the sheath wave barrier.

In the present context, "compensating" shall mean that the magnetic field produced by the secondary inductor substantially cancels the field produced by the primary inductor in a region outside the two inductors such that the magnetic field produced by the current flowing through both inductors substantially produces no field in said region.

By virtue of the fact that the primary and secondary inductors are electrically connected over respective first and second RLC network members, compensating configurations can be achieved in a geometrically simple manner, without the need to apply sharp bends to the primary inductor, which consists of a shielded cable with generally poor bendability.

Advantageous embodiments are defined in the dependent claims and described further below.

A sheath wave barrier according to the present invention is illustrated in FIG. 2a. It is based on the principle of a field compensated inductor. The current of a simple solenoid inductor is returned through a concentric solenoid with fewer windings and larger diameter. If dimensioned properly, the magnetic field lines passing through the center are forced to return within the annular space between the inner and outer solenoids. This leads to an almost complete cancelling of the magnetic field in the spatial region surrounding the sheath wave barrier.

Depending on the specific situation, it may be preferable to arrange the secondary inductor concentrically either within or around the primary inductor. An arrangement with the secondary inductor being arranged within the primary inductor may be useful when seeking size minimization. This is because it will generally be possible to form smaller windings from the secondary inductor than from the primary inductor, as the latter is formed by a shielded cable which will generally be stiffer that the conductor used to form the secondary inductor. In other situations, it may be preferable to arrange the primary inductor internally, i.e. surrounded by the secondary conductor, for example if the primary conductor is wound around a suitable central support and kept there.

The secondary compensating inductor can analogously also be added to traps whose primary inductor is formed by strand of cable equipped with an additional surrounding shielding material in analogy to U.S. Pat. No. 5,543,713 A.

In certain embodiments, the sheath wave barrier is permanently disposed in a shielded cable of a component used for certain MR applications. Alternatively, the sheath wave barrier comprises a segment of shielded cable which is provided at its ends with coaxial cable connectors.

As generally known in the technical field and illustrated in FIG. 3a, a sheath wave impedance can be defined for a given shielded cable 4. In particular, a sheath wave impedance magnitude can be defined as $$Z_s = \left|\frac{V_S}{I_S}\right|$$

wherein $V_S$ denotes a potential of the cable sheath and wherein $I_S$ denotes a current flowing along the cable sheath. In general, the sheath wave impedance magnitude of a shielded cable is frequency-dependent. In the following, the sheath wave impedance magnitude $Z_S(\omega_0)$ at the predetermined suppression frequency wo will be of particular interest.

Analogously, one can define an impedance of the sheath wave barrier, which for brevity will be called "trap impedance". As illustrated in FIG. 3b, a trap impedance magnitude can be defined as $$Z_T = \left|\frac{V_T}{I_T}\right|$$

wherein $V_T$ denotes a potential difference across the sheath wave barrier 2 and wherein $I_T$ denotes a current flowing through the sheath wave barrier. The trap impedance magnitude at the predetermined suppression frequency will be denoted as $Z_T(\omega_0)$. It is understood that the all components of the trap, in particular the mentioned first and second inductor as well as mentioned first and second RLC network will contribute to the trap impedance. In particular, resonance conditions found in the entire circuit or sub-circuits can be employed to obtain a high impedance at one or several frequencies.

While any non-zero trap impedance will contribute in reducing unwanted sheath currents, it is generally advantageous if $Z_T(\omega_0)$ is at least equal to or preferably (claim 2) substantially larger than $Z_S(\omega_0)$. A ratio $Z_T(\omega_0)/Z_S(\omega_0)$ of at least 5, particularly at least 10 is preferred.

According to one embodiment (claim 3), the primary inductor and the secondary inductor are each configured as a solenoid comprising a plurality of windings. In order to be configured in compensating manner minimizing the extent of the magnetic field produced by the inductor, the two solenoids are disposed in mutually counter circulating manner. Due to the concentric arrangement of the primary and secondary inductor, their respective solenoid axes are substantially collinear. In one embodiment, the two solenoids are cylindrically symmetric.

Advantageously (claim 4), the primary inductor is configured as a cylindrical solenoid with a first number of windings n1 and a first coil diameter d1, the secondary inductor is configured as a cylindrical solenoid with a second number of winding n2 and a second coil diameter d2, and the ratio d1/d2 of said first and second coil diameters is substantially equal to the square root $\sqrt{(n2/n1)}$ of the ratio of said second and first number of windings. Such an embodiment leads to a high degree of coil compensation.

In principle, the secondary inductor can be formed from virtually any type of electrical conductor. In an advantageous embodiment (claim 5), the secondary inductor is a solid wire, a hollow conductor, a braided conductor or a litz wire. The primary and secondary inductors do not need to be formed of the same material or be of the same conductor type. In particular, the secondary inductor can be formed with a comparatively thin and flexible wire, thereby allowing for a compact design of the sheath wave barrier.

The first and second RLC network members used to form an electric connection between the ends of the secondary inductor and the first and second cable locations of the shielded cable segment can be configured in several manners. According to an advantageous embodiment (claim 6), the first RLC network member is a first capacitor with a first capacitance (C1) and the second RLC network member is either a galvanic connection or a second capacitor with a second capacitance (C2). As will be understood, a galvanic connection can be understood as an RLC network just comprising a resistor with very low resistance.

According to a particularly advantageous embodiment (claim 7), the primary and secondary inductors together with the first and second RLC network members form a parallel resonance circuit at the predetermined suppression frequency ($\omega_0$). Optionally, a resonant behavior and hence a suppression effect is achieved at one further suppression frequency or at even more suppression frequencies.

According to another aspect, a coil assembly for MR imaging applications comprises
- a carrier structure made of non-conducting material; and
- at least one electrically conducting MR coil for receiving and/or emitting signal at an MR coil operating frequency, each coil being attached to and extending along a face of said carrier structure;
- at least one magnetic field probe (P) mounted to said carrier structure, the magnetic field probe comprising
  - a nuclear magnetic resonance (NMR) active substance located in a resonance region within an elongated probe compartment mutually oriented along a longitudinal probe axis and having a proximal end and a distal end;
  - means for pulsed NMR excitation of said substance at a probe RF and for receiving an NMR signal generated by said substance;
  - said excitation and receiving means comprising an electrically conductive structure comprising a coil member disposed around said resonance region and further comprising a pair of connecting leads, said connecting leads forming an electrical connection between respective ends of the coil member and an RF coupling unit arranged near said proximal end, said connecting leads being oriented substantially along said longitudinal probe axis, said RF coupling unit being configured for connecting to an RF line which is connectable to external RF driver and receiver means;

the coil assembly further comprising at least one sheath wave barrier according to one of the preceding claims.

The term "RF coupling unit" shall be understood to include some kind of connecting device for attaching an external RF line, which is typically a shielded cable. Furthermore, the RF coupling unit will generally include some appropriate tuning and matching electronics. The RF coupling unit is located at one end of the elongated probe compartment, which is conveniently constituted by a capillary tube. According to this design, the connecting leads are hence disposed along the capillary. This allows the entire field probe to be encased within a substantially cylindrical shield of ca. 20 mm length and 8 mm diameter.

According to one embodiment (claim 9), the sheath wave barrier is disposed in a shielded electrical cable forming an RF line of a magnetic field probe. In one particular embodiment (claim 10), the sheath wave barrier has a predetermined suppression frequency which is substantially equal to the operating frequency of an MR coil in the system. With such an arrangement, the NMR signal acquired from an NMR probe is protected from interference caused by the high power being sent to the MR coils.

According to another embodiment (claim 11), the sheath wave barrier is disposed in a shielded electrical cable of an RF line of one of said electrically conducting MR coils. In one particular embodiment (claim 12), the sheath wave barrier has a predetermined suppression frequency which is substantially equal to said probe RF frequency. With such an arrangement, the MR signal obtained with said acquisition means is protected from interference caused by the high RF power being sent to the NMR probes.

According to a further aspect, there is provided an MR apparatus for carrying out MR imaging or spectroscopy of a subject, the MR apparatus comprising:
a) magnet means for generating a main magnetic field (B) along a field direction in a sample region;
b) encoding means for generating encoding magnetic fields superimposed to the main magnetic field,
c) RF transmitter means for generating radiofrequency fields at said MR coil operating frequency;
d) driver means for operating said encoding means and RF transmitter means to generate superimposed time dependent encoding fields and radiofrequency fields according to an MR sequence for forming images or spectra; and
e) acquisition means for acquiring an MR signal from said subject, the MR apparatus further comprising at least one sheath wave barrier as defined above disposed in a shielded electrical cable of the MR apparatus.

According to one embodiment (claim 14), at least two sheath wave barriers are serially disposed in respective segments of a common shielded cable of an MR apparatus. In particular, two serially arranged sheath wave barriers with different suppression frequencies may be used in certain multi-frequency MR applications.

According to a further embodiment (claim 15), the MR apparatus is operatively connected to a coil assembly as defined further above. The term "operatively connected" means, in particular, that each one of said electrically conducting MR coils is connected to an associated RF transmitter means c) and/or acquisition means d).

BRIEF DESCRIPTION OF THE DRAWINGS

The above mentioned and other features and objects of this invention and the manner of achieving them will become more apparent and this invention itself will be better understood by reference to the following description of embodiments of this invention taken in conjunction with the accompanying drawings, wherein are shown.

DETAILED DESCRIPTION OF THE INVENTION

Figure 1A:
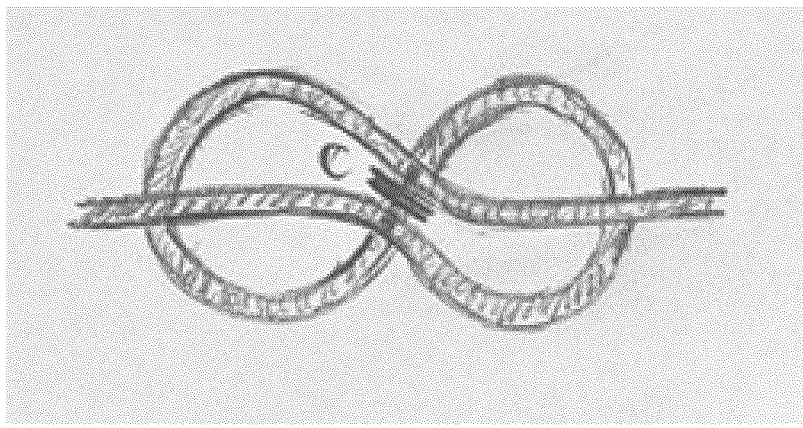
FIG. 1 A schematic representation of two sheath wave barriers according to prior art: a) figure-8 winding, b) simple toroidal winding.
Figure 1B:
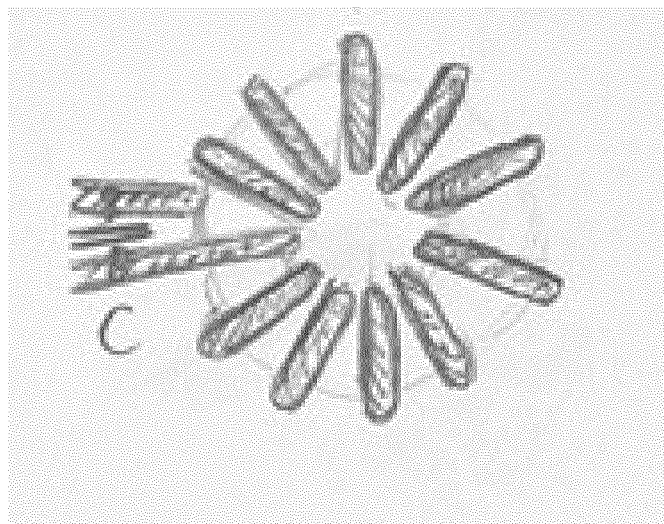
Figure 2A:
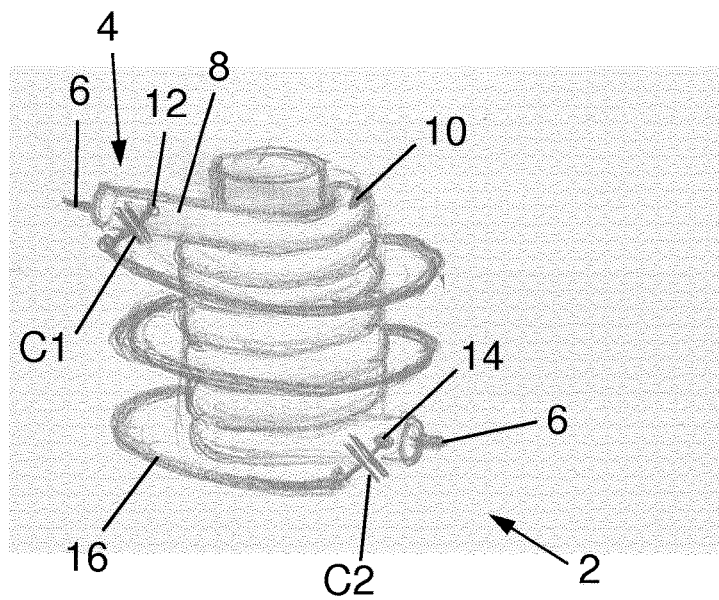
FIG. 2 a schematic representation of: a) a sheath wave barrier according to the present invention, and b) mutually counter circulating current in two concentric solenoids forming such a sheath wave barrier.
Figure 2B:
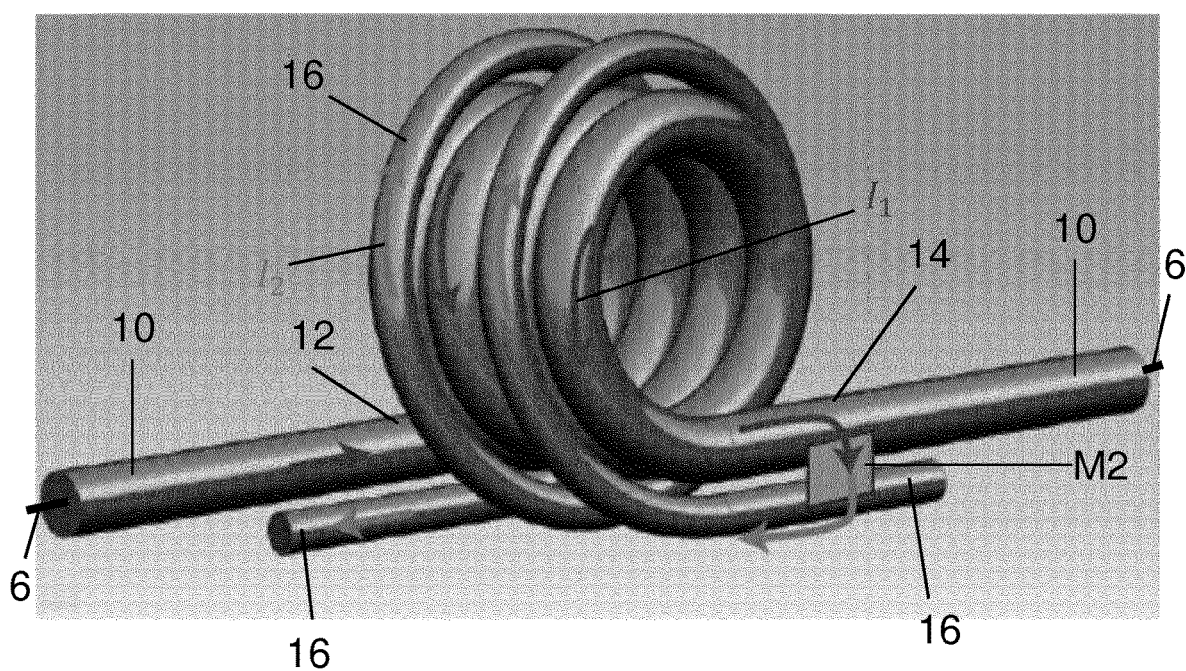
Figure 3A:
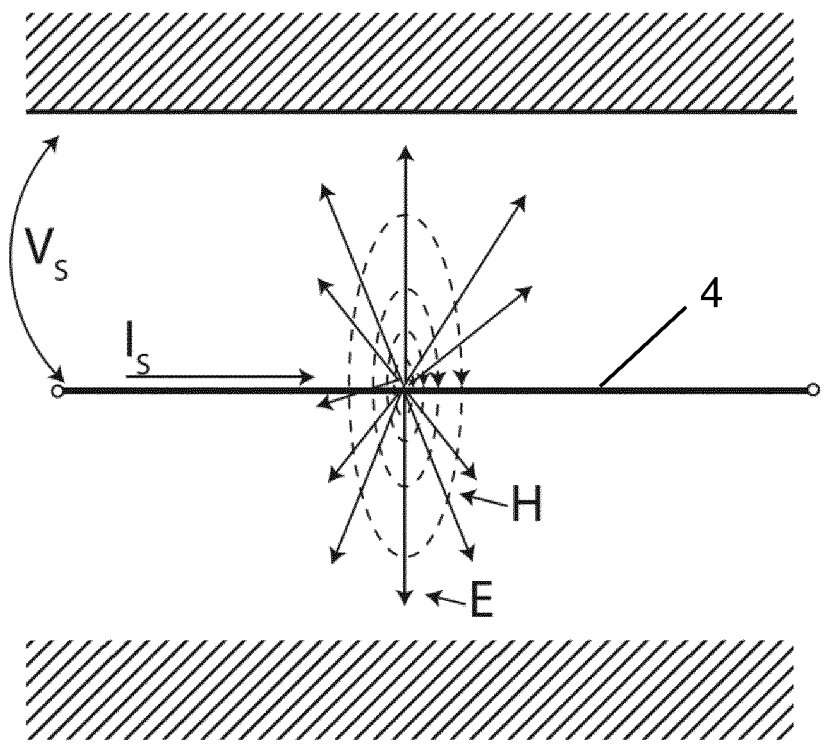
FIG. 3 a schematic representation of: a) sheath wave impedance, and b) trap impedance.
Figure 3B:
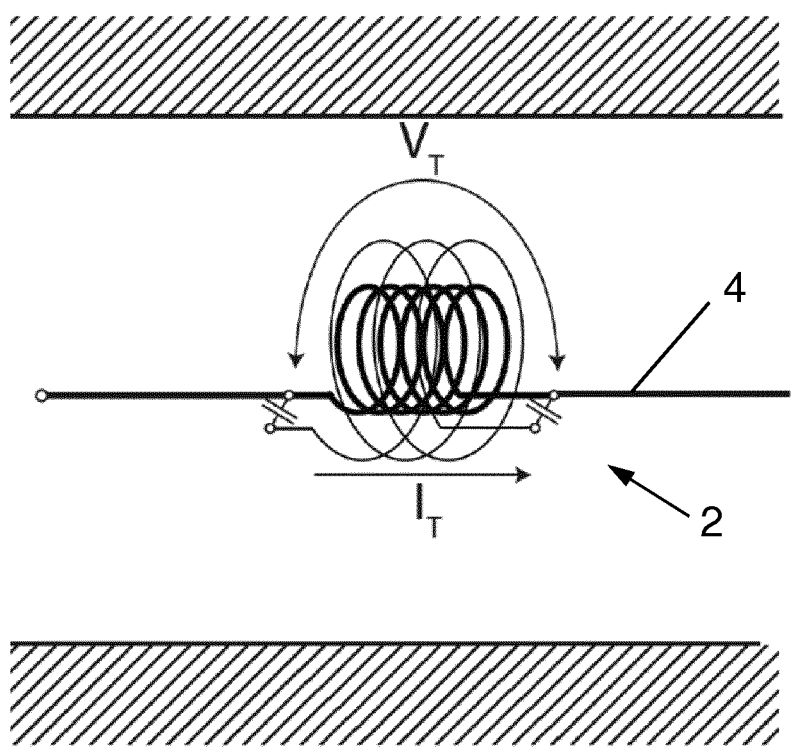

FIG. 2a shows a sheath wave barrier 2 for suppressing electromagnetic RF coupling phenomena of an electrical cable 4 at a predetermined suppression frequency ($\omega_0$) in a magnetic resonance (MR) imaging or spectroscopy apparatus. The cable 4 is a shielded cable with an inner conductor 6 and a peripherally surrounding electrically conducting cable sheath 8. The sheath wave barrier 2 comprises a segment of the shielded cable, a primary inductor 10 formed from the shielded cable 4 between a first cable location 12 and a second cable location 14, and a secondary inductor 16 formed by a conductor. In the example shown, the secondary inductor 16 is made of a simple cable concentrically arranged around the primary inductor 10 and is electrically connected to the cable sheath 8 at said first and second cable connections 12 and 14. The primary inductor 10 and the secondary inductor 16 are configured as concentric and substantially coaxial solenoids. In order to be configured in compensating manner, the two solenoids are disposed in mutually counter circulating manner. The meaning of "counter circulating" is illustrated in FIG. 2b, where it is seen that the currents flowing through the two solenoids and depicted as arrows $I_1$ and $I_2$, respectively, have mutually opposite senses of rotation. As a consequence. the resulting magnetic fields have opposite direction. By appropriate dimensioning of the solenoids, the resulting magnetic fields cancel each other.

In general, the secondary inductor is electrically connected to the cable sheath over respective first and second RLC network members. In the example shown in FIG. 2a, both RLC network members are constituted by capacitors C1 and C2, respectively.

Figure 4A:
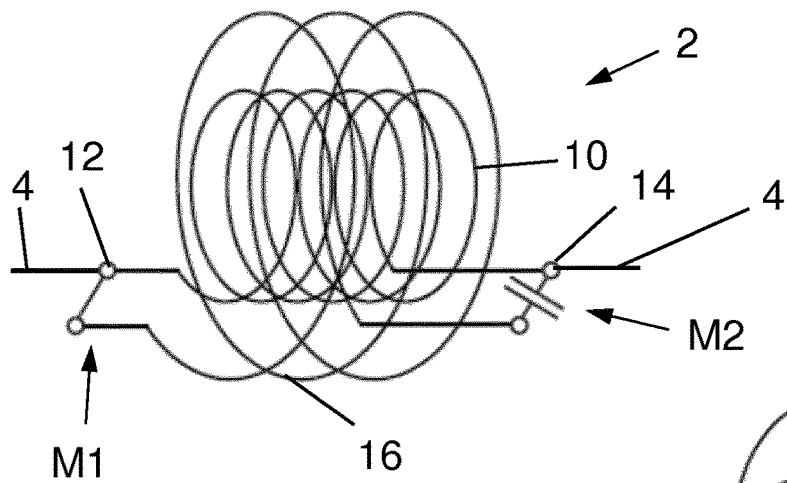
FIG. 4 a schematic representation of various embodiments of sheath wave barriers according to the present invention.
Figure 4B:
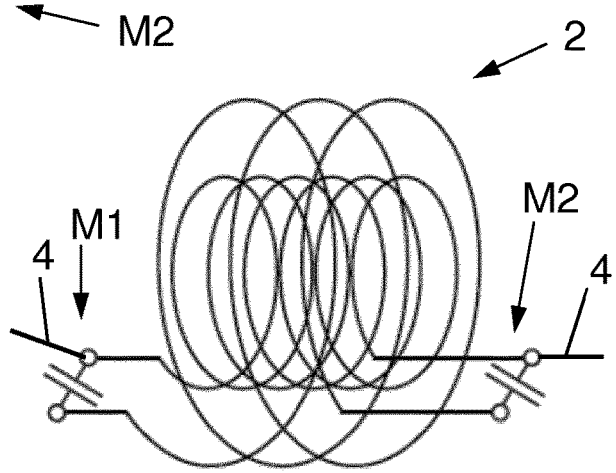
Figure 4C:
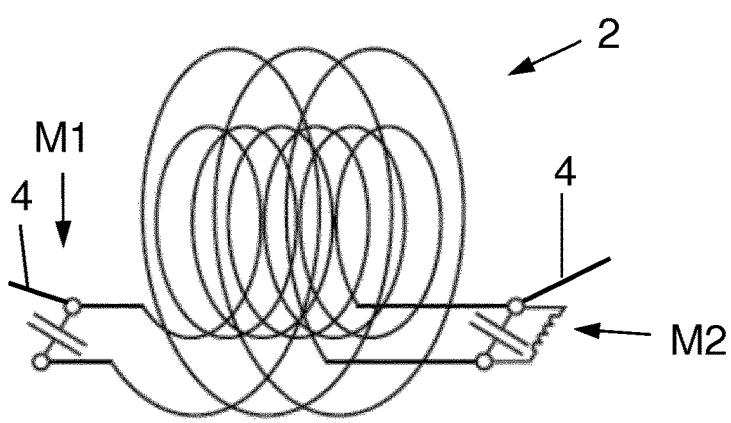
Figure 4D:
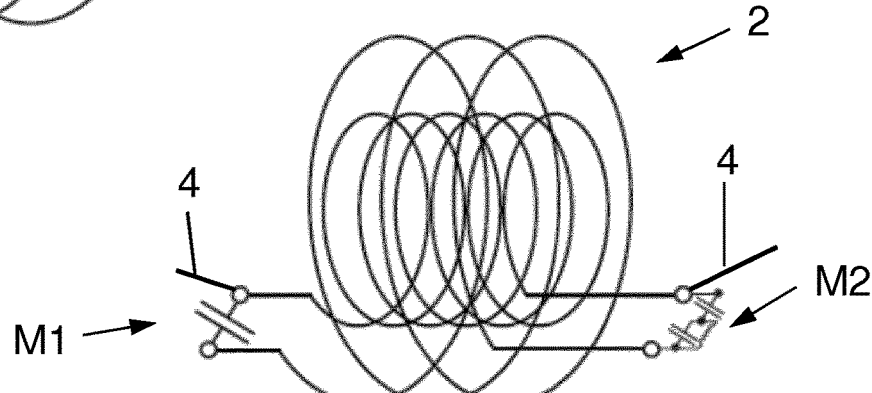

Various possibilities for the first and second RLC network members are shown in FIG. 4:

in FIG. 4a, the first RLC network member M1 is a galvanic connection and the second RLC network member M2 is a capacitor, in FIG. 4b, both RLC network members M1 and M2 are capacitors, in FIG. 4c, the first RLC network member M1 is a capacitor and the second RLC network member M2 is a parallel LC-member;

in FIG. 4d, the first RLC network member M1 is a capacitor and the second RLC network member M2 is a parallel LC-member serially connected with a further capacitor.

Figure 5:
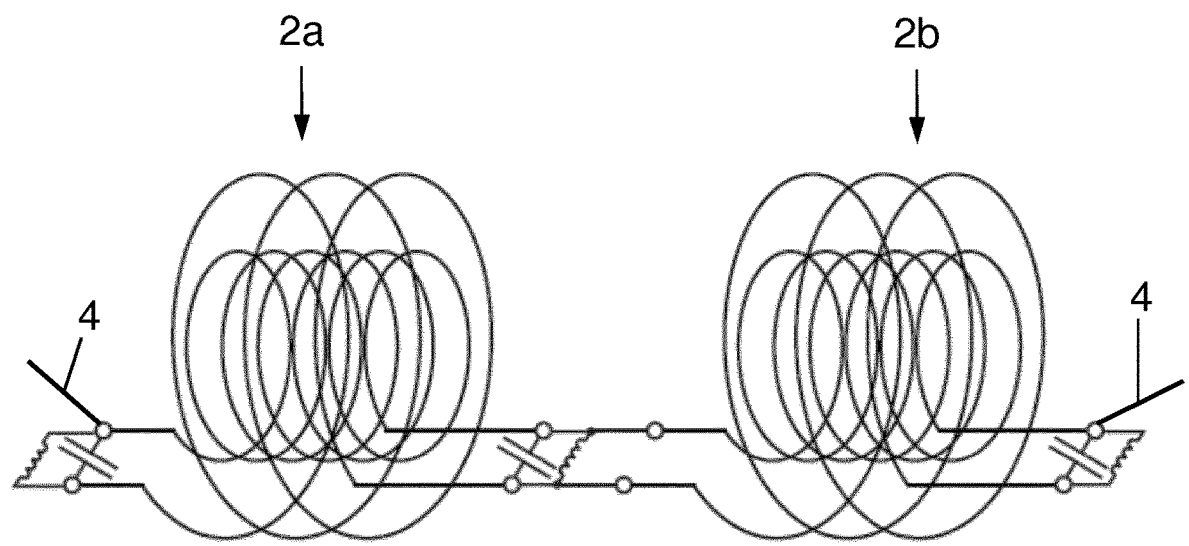
FIG. 5 a schematic representation of two sheath wave barriers connected in series.

A more complex arrangement is shown in FIG. 5, which represents a first sheath wave barrier 2a and a second sheath wave barrier 2b connected in series within a common shielded cable 4.

Figure 6:
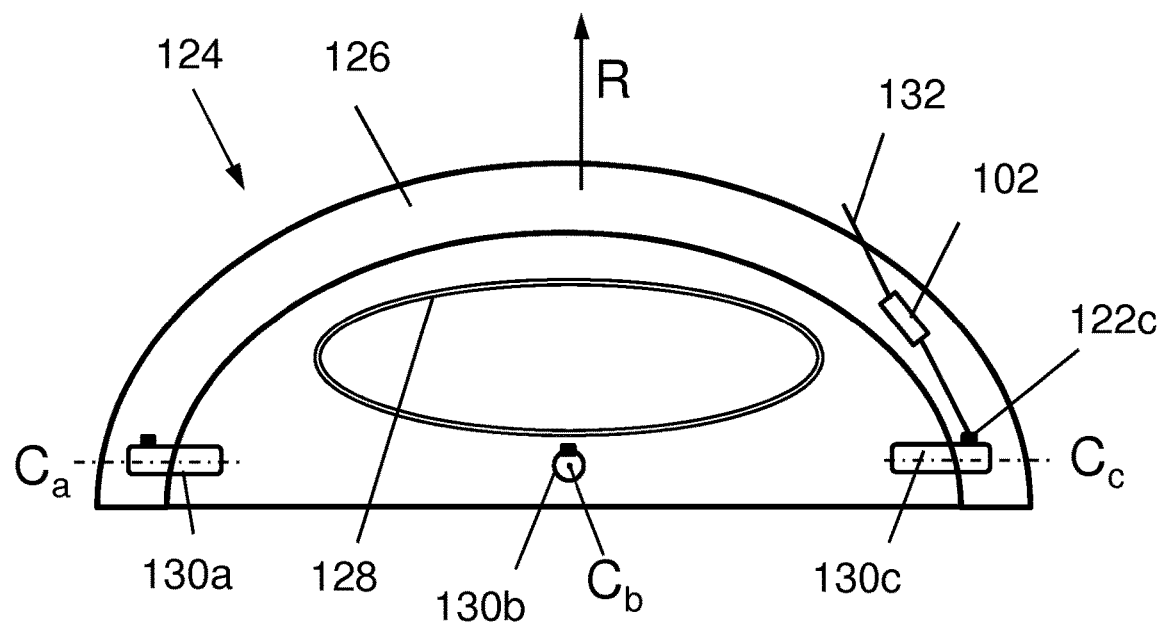
FIG. 6 a coil assembly for MR imaging applications, as a vertical section.

FIG. 6 shows a coil assembly 124 for MR imaging applications, which comprises a carrier structure 126 made of non-conducting material and further comprises an electrically conducting MR coil 128 for receiving and/or emitting signal at an MR coil operating frequency. The MR coil is attached to and extends along a face of the carrier structure 126. Moreover, the coil assembly 124 comprises, in the example shown, three magnetic field probes 130a, 130b, 130c. The carrier structure 126 has a cap-like hollow shape as might be used for application on a human head. As also shown in FIG. 6 for one probe, a respective RF coupling unit 122c is connected to an RF line 132 which is connectable to external RF driver and receiver means not shown in the figure. The RF line 132 is provided with a sheath wave barrier 102 of the type described above.

EXAMPLES

A simple solenoid coil (diameter 5 mm, length 10 mm, 10 windings) was provided with a concentric compensation solenoid (diameter 7.9 mm, length 10 mm, 4 windings). The effect of the added compensation solenoid is:

Reduction of the inductance from 154 nH to 107 nH

Reduction of the Q-Factor from 209 to 175 (when tuned to the same frequency)

Reduction of the field-strength by 20 dB at 3 mm distance and 35 dB at 9 mm distance Compensated Cable Trap In the compensated cable trap the center inductor is built from the shielding of the cable itself. The compensation inductor is built with a separate wire and connected on both sides via the resonance capacitors to the cable shield. Cable and compensation wire are mounted on a dedicated holder to ensure tight tolerances.

The compact and almost point-symmetric construction provide improved specifications compared to the other designs:

reduced size good attenuation of surface currents (ca 35 dB)

broader frequency span of the attenuation due to the smaller Q-factor (less prone to drifts and tolerances)

reduced trap detuning through coupling to nearby objects and reduced cross-coupling between neighboring traps, due to the strong field decay around the trap structure reduced coupling with external fields (e.g. RF transmit-field or fields of receive-coils)

reduced coupling with external fields that have linear gradients of the field strengths in any direction (this feature is a consequence of the device being point-symmetric and therefore not present in other designs)

Improved performance in close vicinity (nearfield) of other coils.

Minimal induction of eddy currents by switching image encoding gradient fields.

The invention claimed is:

1. A sheath wave barrier for suppressing electromagnetic RF coupling phenomena of an electrical cable at a predetermined suppression frequency ($\omega_0$) in a magnetic resonance (MR) imaging or spectroscopy apparatus, the cable being configured as a shielded cable, the sheath wave barrier comprising:

a segment of said shielded cable comprising at least one inner conductor and a peripherally surrounding electrically conducting cable sheath surrounding the at least one inner conductor;

a primary inductor formed from said shielded cable segment between a first cable location and a second cable location;

a secondary inductor formed by a conductor, said secondary inductor being concentrically arranged within or around the primary inductor between said first and second cable locations;

said secondary inductor being electrically connected to the cable sheath at first and second cable connections over respective first and second RLC network members;

said primary and secondary inductors being configured in compensating manner such that a magnetic field generated by said primary and secondary inductors is substantially cancelled in any region surrounding the sheath wave barrier suppressing said electromagnetic RF coupling phenomena of the electrical cable at a predetermined suppression frequency ($\omega_0$) in the magnetic resonance (MR) imaging or spectroscopy apparatus.

2. The sheath wave barrier according to claim 1, wherein at said suppression frequency the sheath wave barrier has a trap impedance magnitude $Z_T(\omega_0)$ that is substantially larger than the sheath wave impedance magnitude $Z_S(\omega_0)$ of the shielded cable.

3. The sheath wave barrier according to claim 1, wherein the primary inductor and the secondary inductor are each configured as a solenoid, the two solenoids being disposed in mutually counter circulating manner.

4. The sheath wave barrier according to claim 3, wherein the primary inductor is configured as a cylindrical solenoid with a first number of windings n1 and a first coil diameter d1 and wherein the secondary inductor is configured as a cylindrical solenoid with a second number of winding n2 and a second coil diameter d2, and wherein the ratio d1/d2 of said first and second coil diameters is equal to the square root $\sqrt{(n2/n1)}$ of the ratio of said second and first number of windings.

5. The sheath wave barrier according to claim 1, wherein the secondary inductor is a solid wire, a hollow conductor, a braided conductor or a litz wire.

6. The sheath wave barrier according to claim 1, wherein said first RLC network member is a first capacitor with a first capacitance and wherein said second RLC network member is a galvanic connection or a second capacitor with a second capacitance.

7. The sheath wave barrier according to claim 6, wherein said primary and secondary inductors together with said first and second RLC network members form a parallel resonance circuit at said suppression frequency ($\omega_0$) and, optionally, at one or more further suppression frequencies.

8. A coil assembly for MR imaging applications, comprising
a carrier structure made of non-conducting material; and
at least one electrically conducting MR coil for receiving and/or emitting signal at an MR coil operating frequency, each coil being attached to and extending along a face of said carrier structure;
at least one magnetic field probe (P) mounted to said carrier structure, the magnetic field probe comprising
a nuclear magnetic resonance (NMR) active substance located in a resonance region within an elongated probe compartment mutually oriented along a longitudinal probe axis and having a proximal end and a distal end;
excitation and receiving means for pulsed NMR excitation of said substance at a probe RF and for receiving an NMR signal generated by said substance;
said excitation and receiving means comprising an electrically conductive structure comprising a coil member disposed around said resonance region and further comprising a pair of connecting leads, said connecting leads forming an electrical connection between respective ends of the coil member and an RF coupling unit arranged near said proximal end, said connecting leads being oriented substantially along said longitudinal probe axis, said RF coupling unit being configured for connecting to an RF line which is connectable to external RF driver and receiver means;
the coil assembly further comprising at least one sheath wave barrier comprising:
a segment of said shielded cable comprising at least one inner conductor and a peripherally surrounding electrically conducting cable sheath surrounding the at least one inner conductor;
a primary inductor formed from said shielded cable segment between a first cable location and a second cable location;
a secondary inductor formed by a conductor, said secondary inductor being concentrically arranged within or around the primary inductor between said first and second cable locations;
said secondary inductor being electrically connected to the cable sheath at said first and second cable connections over respective first and second RLC network members;
said primary and secondary inductors being configured in compensating manner such that a magnetic field generated by said primary and secondary inductors is substantially cancelled in any region surrounding the sheath wave barrier.

9. The coil assembly according to claim 8, wherein said sheath wave barrier is disposed in a shielded electrical cable forming an RF line of said magnetic field probe.

10. The coil assembly according to claim 9, wherein said sheath wave barrier has a predetermined suppression frequency which is substantially equal to said MR coil operating frequency.

11. The coil assembly according to claim 8, wherein said sheath wave barrier is disposed in a shielded electrical cable of an RF line of one of said electrically conducting MR coils.

12. The coil assembly according to claim 11, wherein said sheath wave barrier has a predetermined suppression frequency which is substantially equal to said NMR probe RF frequency.

13. An MR apparatus for carrying out MR imaging or spectroscopy of a subject, the MR apparatus comprising:
a) magnet for generating a main magnetic field along a field direction in a sample region;
b) encoder for generating encoding magnetic fields superimposed to the main magnetic field,
c) RF transmitter for generating radiofrequency fields at said MR coil operating frequency;
d) driver for operating said encoding means and RF transmitter means to generate superimposed time dependent encoding fields and radiofrequency fields according to an MR sequence for forming images or spectra; and
e) acquisition means for acquiring an MR signal from said subject,
the MR apparatus further comprising, disposed in a shielded electrical cable of the MR apparatus, at least one sheath wave barrier comprising:
a segment of said shielded cable comprising at least one inner conductor and a peripherally surrounding electrically conducting cable sheath surrounding the at least one inner conductor;

a primary inductor formed from said shielded cable segment between a first cable location and a second cable location;

a secondary inductor formed by a conductor, said secondary inductor being concentrically arranged within or around the primary inductor between said first and second cable locations;

said secondary inductor being electrically connected to the cable sheath at said first and second cable connections over respective first and second RLC network members;

said primary and secondary inductors being configured in compensating manner such that a magnetic field generated by said primary and secondary inductors is substantially cancelled in any region surrounding the sheath wave barrier.

14. The MR apparatus according to claim 13, comprising two sheath wave barriers serially disposed in respective segments of one shielded electrical cable of the MR apparatus.

15. The MR apparatus according to claim 13, which is operatively connected to a coil assembly comprising:

a carrier structure made of non-conducting material; and at least one electrically conducting MR coil for receiving and/or emitting signal at an MR coil operating frequency, each coil being attached to and extending along a face of said carrier structure;

at least one magnetic field probe (P) mounted to said carrier structure, the magnetic field probe comprising a nuclear magnetic resonance (NMR) active substance located in a resonance region within an elongated probe compartment mutually oriented along a longitudinal probe axis and having a proximal end and a distal end;

excitation and receiving means for pulsed NMR excitation of said substance at a probe RF and for receiving an NMR signal generated by said substance;

said excitation and receiving means comprising an electrically conductive structure comprising a coil member disposed around said resonance region and further comprising a pair of connecting leads, said connecting leads forming an electrical connection between respective ends of the coil member and an RF coupling unit arranged near said proximal end, said connecting leads being oriented substantially along said longitudinal probe axis, said RF coupling unit being configured for connecting to an RF line which is connectable to external RF driver and receiver means; wherein the coil assembly comprises the at least one sheath wave barrier.

16. A method for suppressing electromagnetic RF coupling phenomena of an electrical cable comprising:

providing the sheath wave barrier of claim 1, wherein the magnetic field generated by said primary and secondary inductors is substantially cancelled in any region surrounding the sheath wave barrier suppressing said electromagnetic RF coupling phenomena of the electrical cable at a predetermined suppression frequency ($\omega_0$) in the magnetic resonance (MR) imaging or spectroscopy apparatus.

* * * * *